United States Patent [19]
Hulick

[11] Patent Number: 5,450,044
[45] Date of Patent: Sep. 12, 1995

[54] QUADRATURE AMPLITUDE MODULATOR INCLUDING A DIGITAL AMPLITUDE MODULATOR AS A COMPONENT THEREOF

[75] Inventor: Timothy P. Hulick, Schwenksville, Pa.

[73] Assignee: Acrodyne Industries, Inc., Blue Bell, Pa.

[21] Appl. No.: 45,790

[22] Filed: Apr. 14, 1993

[51] Int. Cl.$^6$ .......................... H03C 1/54; H03C 1/60; H03C 3/40

[52] U.S. Cl. .................................... 332/103; 332/167; 332/170

[58] Field of Search ............... 332/103, 167, 170, 168, 332/169, 171, 104, 105; 455/46, 47, 109

[56] References Cited

U.S. PATENT DOCUMENTS

| | | | |
|---|---|---|---|
| 3,054,073 | 9/1962 | Powers | 332/170 |
| 3,243,731 | 3/1966 | Erickson | 332/170 |
| 3,480,881 | 11/1969 | Boykin | 332/149 |
| 3,490,054 | 1/1970 | Seidel | 333/109 |
| 3,496,491 | 2/1970 | Krause | 332/167 |
| 3,678,415 | 7/1972 | Kuroda | 333/117 |
| 3,757,222 | 9/1973 | Oberbury | 455/109 |
| 3,827,001 | 7/1974 | Laughlin | 333/127 |
| 3,869,585 | 3/1975 | Snyder | 333/118 |
| 4,068,100 | 1/1978 | Thompson | 381/16 |
| 4,182,996 | 1/1980 | Spence | 333/100 |
| 4,403,197 | 9/1983 | Swanson | 330/10 |
| 4,514,699 | 4/1985 | Kariatsumari et al. | 330/53 |
| 4,534,040 | 8/1985 | Thapar | 375/39 |
| 4,571,549 | 2/1986 | Lods et al. | 332/103 |
| 4,580,111 | 4/1986 | Swanson | 332/152 |
| 4,635,004 | 1/1987 | Ishigaki | 332/170 |
| 4,654,608 | 3/1987 | Minarik et al. | 332/151 |
| 4,661,948 | 4/1987 | Shapiro | 370/77 |
| 4,717,894 | 1/1988 | Edwards et al. | 332/144 |
| 4,726,039 | 2/1988 | Piesinger | 332/105 |
| 4,804,931 | 2/1989 | Hulick | 332/163 |
| 5,153,536 | 10/1992 | Müller | 332/105 |
| 5,185,586 | 2/1993 | Zucker | 331/96 |

*Primary Examiner*—Andrew M. Dolinar
*Attorney, Agent, or Firm*—Popham, Haik, Schnobrich & Kaufman, Ltd.

[57] ABSTRACT

The invention provides various embodiments of a balanced modulator, each of which involves one or more individual amplitude modulators which, individually, do not provide suppressed-carrier outputs. A first embodiment employs a single amplitude modulator whose carrier input is selectively delayed by a half wavelength, depending on the polarity of the input modulating signal, and whose amplitude input receives the absolute value of the modulating input signal. A second embodiment involves summation of the outputs of two amplitude modulators whose carrier inputs are responsive to carrier signals offset by a half carrier wavelength and whose modulating signal inputs are responsive only to signals of respectively opposite polarity. Further, quadrature amplitude modulation (QAM) modulators are provided by a combination of the above-described modulators. Moreover, another embodiment of the QAM modulator involves use of an amplitude modulator operating on polar coordinate representations of the input modulating signal. The invention is useful in single sideband modulation, up-conversion, down-conversion, synchronous detection, product detection, and the like.

4 Claims, 6 Drawing Sheets

QUADRATURE AMPLITUDE MODULATOR INCLUDING A DIGITAL AMPLITUDE MODULATOR AS A COMPONENT THEREOF

CROSS-REFERENCE TO RELATED APPLICATIONS

The present patent application has the same Assignee as U.S. patent application Ser. No. 07/924,525, filed Aug. 4, 1992, now U.S. Pat. No. 5,260,674 and is related to U.S. Pat. No. 4,804,931, issued Feb. 14, 1989. Both documents are incorporated herein by reference.

BACKGROUND OF THE INVENTION

1. Field of the Invention

The present invention relates to modulators. More specifically, the invention relates to balanced modulators (those having no carrier component in the output waveform), especially balanced quadrature amplitude modulation (QAM) modulators.

2. Related Art

Figure 1:
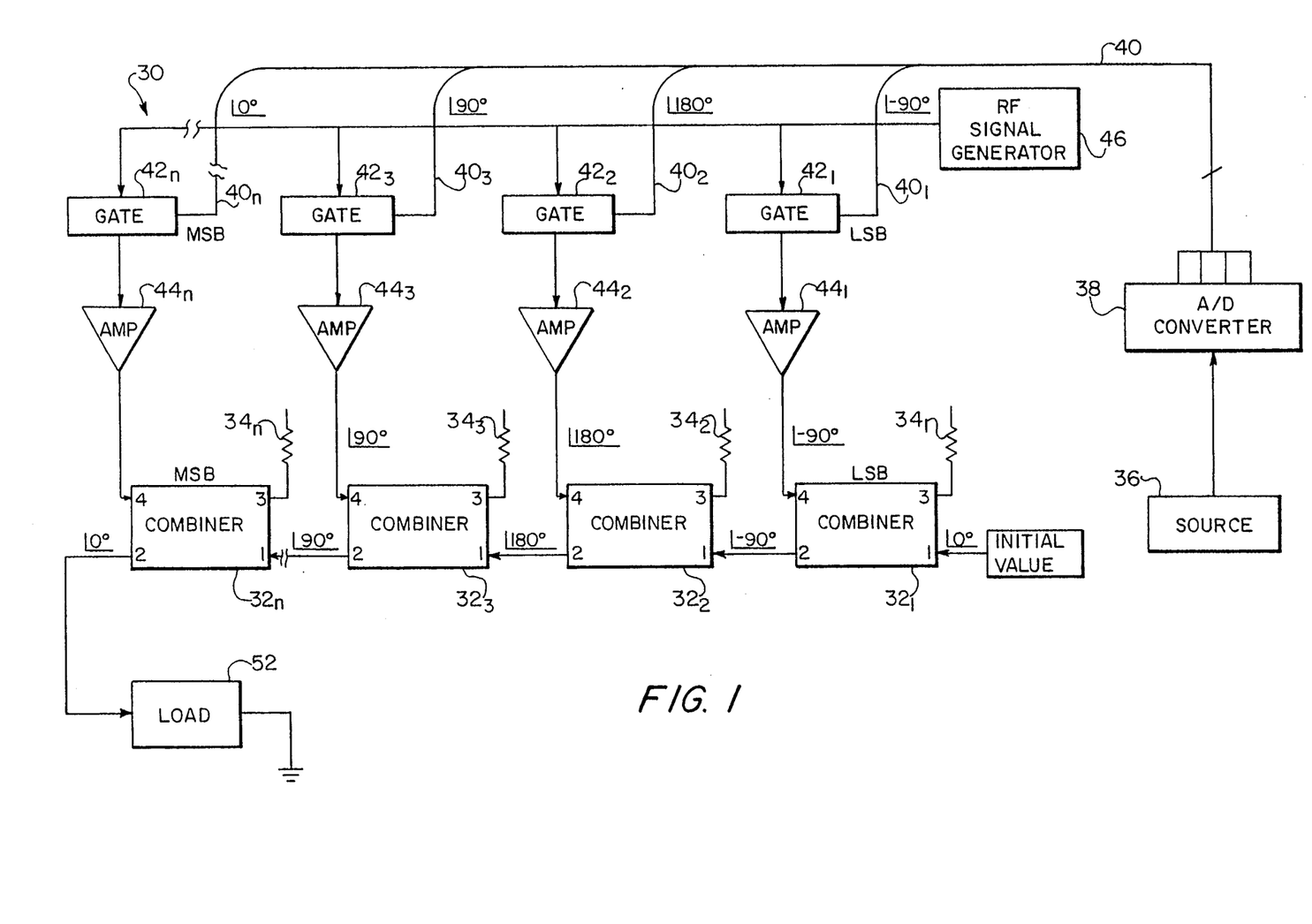
FIG. 1 illustrates an amplitude modulator constructed in accordance with the teachings of U.S. Pat. No. 4,804,931.

In U.S. Pat. No. 4,804,931 (which is incorporated herein by reference in its entirety), a digital amplitude modulator-transmitter is described. An amplitude modulator-transmitter embodying the teachings of the '931 patent is illustrated in FIG. 1.

The amplitude modulator 30 includes a predetermined number of quadrature hybrid power devices $32_1$-$32_n$. The quadrature hybrid power devices $32_1$-$32_n$ are configured as combiners, and are arranged in cascade so that the output of one combiner is the first of two inputs of a successive combiner. In the exemplary illustration of FIG. 1, only four combiners are shown for ease of understanding.

The construction and operation of a quadrature hybrid device is described in detail in the '931 patent, and need not be described here. However, for purposes of the present discussion, a quadrature hybrid combiner may be implemented as a four-port device having first and second inputs, one output, and one isolated port. The first and second inputs receive two signals of a given amplitude that are 90° apart in phase. The input signals are combined to provide an output signal having an amplitude that is the sum of the amplitudes of the input signals. As shown in FIG. 1, ports 1 and 4 represent the first and second input ports. Port 3 represents an isolation port to which is attached a resistor representing a dummy load 34. Finally, port 2 defines the output port of each of the combiners.

An analog signal source 36, such as a microphone or a video generator, produces an analog signal that passes through an analog-to-digital converter (A/D converter, or ADC) 38. The digital output of the A/D converter appears on data lines 40.

As an example, there are four data lines, so that data consists of four-bit words. However, it is contemplated that 12- or 16-bit words may be employed to improve the quality of the signals being transmitted. Further, it is contemplated that a digital input signal may be fed directly to gates 42 without the need for A/D converter 38, should the modulating signal already exist in binary form.

Each of the bits, from the least significant bit (LSB) to the most significant bit (MSB), controls a respective gate $42_1$-$42_n$. Each of the gates is connected in series with a corresponding amplifier $44_1$-$44_n$. The series combinations receive an RF signal from an RF signal generator 46, and provide respective second inputs to the combiners.

The output port of the LSB combiner $32_1$ represents the least significant bit of the digital word describing the instantaneous value of the signal to be modulated. The second input of the combiner $32_2$, adjacent the LSB combiner $32_1$, represents a value that is twice as significant as that of the second input of the LSB combiner $32_1$. Similarly, the second input of each successive combiner represents a value twice as significant as that input to the immediately preceding combiner.

Thus, the output of each combiner represents a binary weighted power signal. In particular, the signal appearing at the output of the MSB combiner $42_n$ represents the sum of the power signals fed into the various combiners. This output signal is fed for transmission to a load, typically an antenna with conventional filtering.

The modulator-transmitter in the '931 patent has many advantages, such as its ability to provide pseudo-continuous amplitude modulation at any modulation index between 0 and 1, at any carrier frequency, using any one of the wide variety of classes of amplifiers. However, it is not a balanced modulator, as a carrier component is present in the output waveform, Thus (assuming a sinusoidal modulating signal of angular frequency $\omega_m$), corn), the digital amplitude-modulator described in the '931 patent provides an output signal which may be represented as:

$$S_{AM}(t) = A(1 = \cos \omega_m t)(\cos \omega_c t) \quad (1)$$

where:
  $S_{AM}(t)$ is the output of the amplitude modulator;
  A is a constant;
  $\omega_m$ is the modulating signal angular frequency;
  $\omega_c$ is the carrier signal angular frequency; and
  t is the variable for time.

As will readily be appreciated by those skilled in the art in light of the '931 disclosure, a carrier frequency component, and symmetrical upper and lower sidebands, are present in the output signal, For various reasons appreciated by those skilled in the art, suppression of the carrier is often desirable. In particular, in formats which may be used for high definition television (HDTV) and digital cellular telephone systems, suppression of the carrier is required.

Generally, a balanced modulator provides an output having no carrier, and may be expressed by the formula:

$$S_{BAL}(t) = A(\cos \omega_m t)(\cos \omega_c t) \quad (2)$$

This formula assumes that the modulating waveform is sinusoidal in form with an angular frequency of $\omega_m$. More generally, a balanced modulator receiving an arbitrary modulating waveform a(t) having no DC component provides an output that can be described by the formula:

$$S_{BAL}(t) = A(a(t)) \cos \omega_c t \quad (3)$$

However, the '931 patent does not describe a manner in which a balanced modulator may be implemented. It is to meet this need that the present invention is directed.

Various patents are directed to modulators. For example, U.S. Pat. No. 5,153,536 (Muller) discloses a QAM modulator having an arrangement of double modulators and partial modulators. U.S. Pat. No. 3,757,222 (Oberbury) discloses a single sideband generator involving selective switching of transmission line links. U.S. Pat. No. 4,635,004 (Ishigaki) discloses a single sideband generator in which quarterwave-shifted signals are alternately input to a balanced modulator. U.S. Pat. No. 4,717,894 (Edwards et al. ) discloses a method of calibrating a vector modulator involving in-phase and quadrature components. Finally, U.S. Pat. No. 4,068,100 (Thompson) discloses an AM stereo system in which opposite-polarity half-cycles of a carrier are separately modulated with a different channel. However, none of the existing art is believed to provide all the advantages of the present invention.

SUMMARY OF THE INVENTION

The invention provides various embodiments of a balanced modulator, each of which involves one or more individual amplitude modulators which, individually, do not provide suppressed-carrier outputs. A first embodiment employs a single amplitude modulator whose carrier input is selectively delayed by a half wavelength, depending on the polarity of the input modulating signal, and whose amplitude input receives the absolute value of the modulating input signal. A second embodiment involves summation of the outputs of two amplitude modulators whose carrier inputs are responsive to carrier signals offset by a half carrier wavelength and whose modulating signal inputs are responsive only to signals of respectively opposite polarity. Further, quadrature amplitude modulation (QAM) modulators are provided by a combination of the above-described modulators. Moreover, another embodiment of the QAM modulator involves use of an amplitude modulator operating on polar coordinate representations of the input modulating signal. The invention is useful in single sideband modulation, up-conversion, down-conversion, synchronous detection, product detection and the like.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

Figure 2:
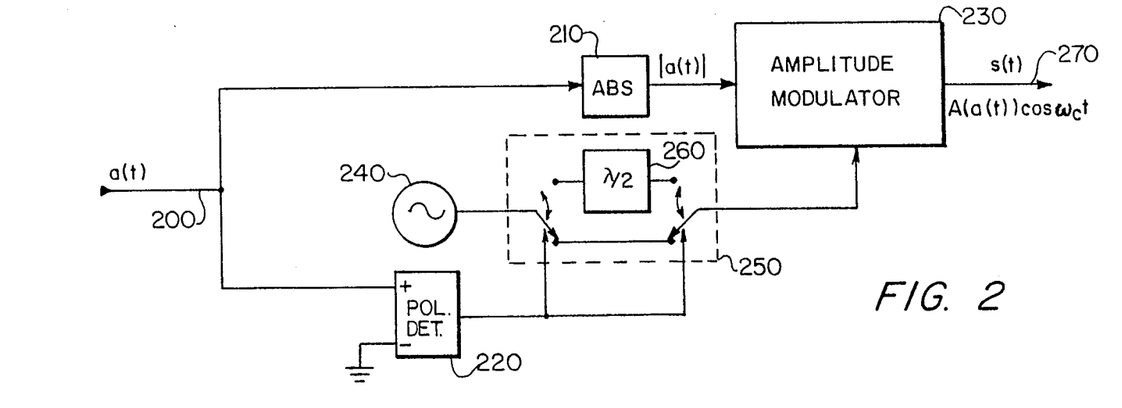
FIG. 2 illustrates a first embodiment of the balanced modulator according to the present invention.

Referring now to FIG. 2, a first balanced modulator according to the present invention is illustrated. The input modulating waveform a(t) is input to the modulator on path 200. Path 200 leads to an absolute value functional block 210 and a polarity detector 220. The absolute value functional block 210 provides the instantaneous absolute value of a(t) to the modulating data input of a digital amplitude modulator 230. Preferably, the modulator 230 is implemented as the digital amplitude modulator described in the U.S. Pat. No. 4,804,931, described above, with reference to FIG. 1. Modulator 230 provides an output of the type described above, in Formula 3.

Polarity detector 220 provides a binary output, depending on the polarity of the input modulating signal a(t). The binary output of polarity detector 220 is input to the control input of a switch arrangement 250. The switch arrangement 250 receives a single input, from a carrier generator 240 which produces a signal A cos $\omega_c t$. The switch arrangement 250 provides a carrier output to modulator 230.

Referring briefly to FIG. 1, it is understood that the data input to modulator 230 (FIG. 2) corresponds to the signal between elements 36, 38, and that the carrier input from switch arrangement 250 (FIG. 2) corresponds to RF signal generator 46 (FIG. 1).

Referring more specifically to the details of elements within FIG. 2, polarity detector 220 may be implemented through use of a voltage comparator having a non-inverting input and an inverting input. The modulating input signal a(t) is provided to the non-inverting input, and the inverting input is connected to ground. The comparator's binary output is a first logic state (for example, 1) when a(t) is greater than zero, and the output is a second value (for example, 0) when a(t) is less than zero volts.

Switching arrangement 250 may be implemented as a double pole, double throw switch implemented using gallium arsenide (GaAs) switches which selectively connect, or disconnect, a delay element 260. This delay element may be in the form of a transmission line equal to half the wavelength of the carrier wave. In the illustrated example, when the output of polarity detector 220 is zero, the switches in switch arrangement 250 are connected in the manner illustrated, so as to bypass the half-wavelength delay element 260. Conversely, when polarity detector 220 outputs a 1, the switches connect the opposite poles, so that the half-wavelength delay line 260 is interposed between carrier generator 240 and modulator 230.

Finally, the absolute value function 210 may be implemented according to any suitable configuration, as readily appreciated by those skilled in the art. For example, it may be implemented using a precision full wave rectifier. The elements in FIG. 2 may be implemented differently than as specifically described above, while still remaining within the scope of the present invention. In any event, the modulator of FIG. 2 provides a double sideband suppressed carrier modulation output.

Figure 3:
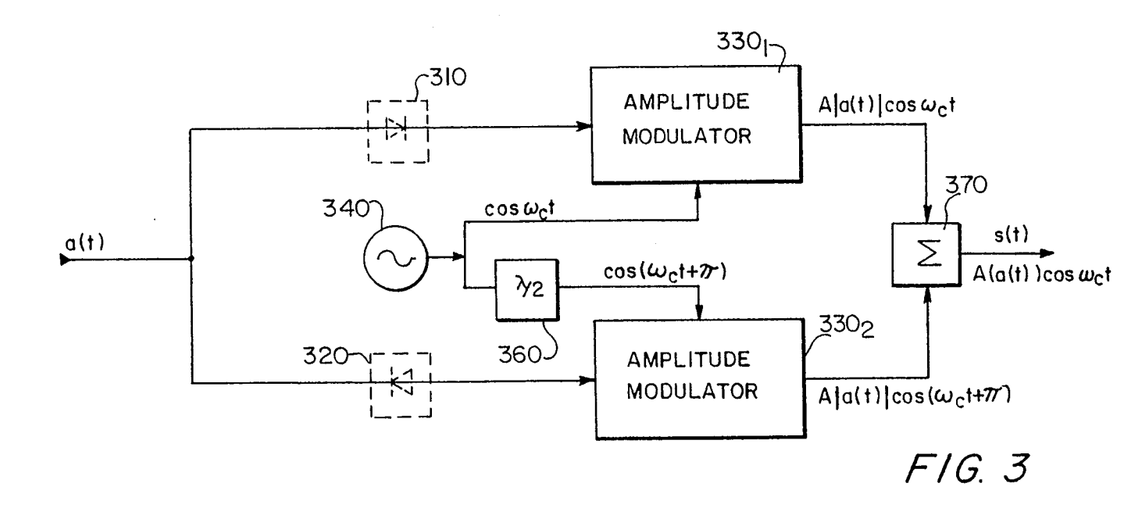
FIG. 3 illustrates a second embodiment of the balanced modulator according to the present invention.

A second embodiment according to the present invention is shown in FIG. 3. The FIG. 3 embodiment employs a duplicate modulator instead of employing a switching arrangement such as that in the FIG. 2 embodiment.

Referring to FIG. 3, the input modulating signal a(t) is input to schematically illustrated clipping circuits 310, 320. Clipping circuit 310 provides an output only when a(t) is greater than zero. Conversely, clipping circuit 320 provides an output only when a(t) is less than zero. Clipping circuits 310, 320 provide their outputs to respective modulators $330_1$, $330_2$. Preferably, these modulators are implemented as the digital amplitude modulator disclosed in U.S. Pat. No. 4,804,931, described with reference to FIG. 1. It is understood that the modulating inputs to the FIG. 3 modulators correspond to the signal between elements 36, 38 in FIG. 1.

Referring again to FIG. 3, a carrier generator 340 is provided, connected to a half-wavelength delay element 360. First modulator $330_1$ receives the output of carrier generator 340 directly, whereas second modulator $330_2$ receives the half-wavelength delayed carrier from delay element 360. It is understood that the carrier inputs in the FIG. 3 modulators correspond to the RF signal generator 46 (FIG. 1).

Modulators $330_1$ and $330_2$ provide respective outputs to a summing element (adder) 370, whose output may be expressed as the generalized balanced modulator Formula 3, provided above. Adder 370 adds the outputs of the two modulators, but it is recognized that, at any given instant, at least one of the modulators will have zero output due to the operation of clipping circuits 310, 320. By implication, the ultimate output of the system, s(t), is the output of the one modulator which is active at any given instant.

The illustration of clipper elements 310, 320 is schematic in nature, and is used for purposes of explanation. In a practical embodiment, each modulator $330_1$, $330_2$ would have its own analog-to-digital converter (ADC) at its input. The first modulator's ADC (element 38 in FIG. 1) is configured to respond with measurable (non-zero) output only when its input is greater than zero. Conversely, the second modulator's ADC provides non-zero output only when the modulating input wave form a(t) is less than zero. In this manner, actual analog clipping elements 310, 320 are avoided. As described in the '930 patent, each of the individual modulators 230, $330_1$, $330_2$ (FIGS. 2–3) may take advantage of the high efficiency of non-linear RF amplifiers while still providing a linear amplitude-modulated signal at signal levels high enough for transmission. The present invention builds on the advantages of that modulator by exploiting its efficiency and high signal levels. Moreover, present invention provides apparatus for suppressed-carrier modulation and transmission which is especially suitable for various standardized transmission formats. A notable example is quadrature amplitude modulation (QAM).

QAM modulators provide output in which two carriers, differing in phase by one-quarter wavelength, are suppressed. Usually, the modulating signal input to QAM modulators include a series of pairs of pulses, with the average DC value of each pair of pulses being zero. Advantageously, the present invention provides a QAM modulator which can modulate any arbitrary input waveform having no DC component, even those not of the paired pulse standard.

Figure 4A:
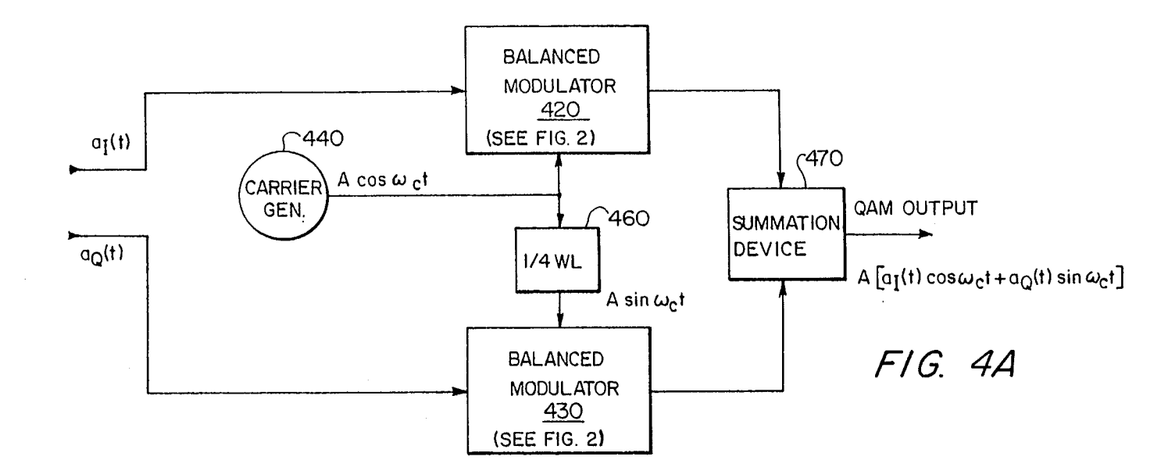
FIGS. 4A and 4B illustrate quadrature amplitude modulators employing balanced modulators according to the embodiments of FIGS. 2 and 3, respectively.
Figure 4B:
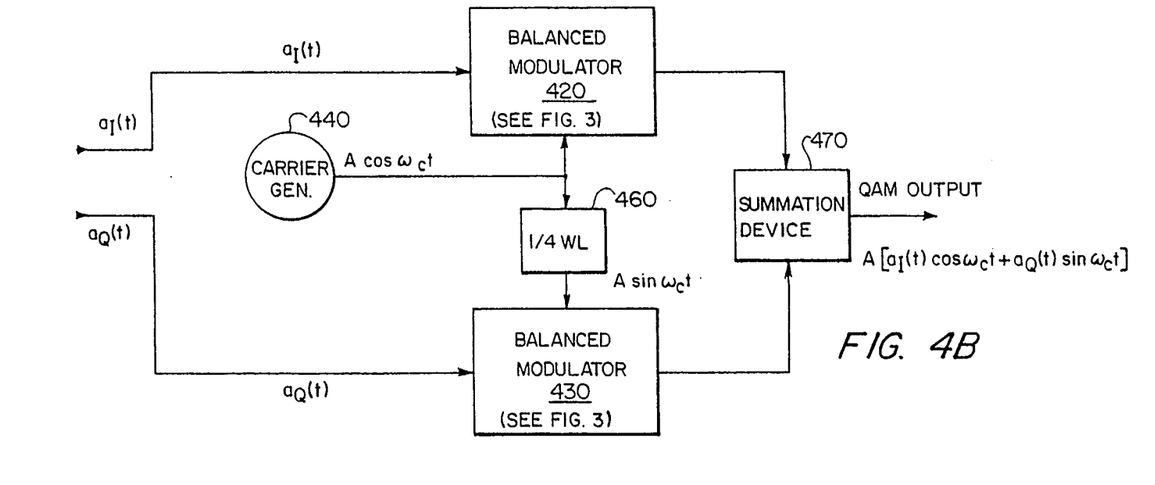

FIGS. 4A and 4B show QAM modulators employing the teachings of the embodiments of FIGS. 2 and 3. The input modulating signal is provided in the form of in-phase and quadrature components $a_I(t)$ and $a_Q(t)$, respectively. These in-phase and quadrature signals are input to the modulating inputs of respective modulators 420, 430. In FIG. 4A, the modulators 420, 430 are indicated as being of the type shown in FIG. 2 (excepting the carrier generator). Similarly, FIG. 4B indicates the modulators 420, 430 being of the type shown in FIG. 3 (again, excepting the carrier generator).

The modulators 420, 430 receive their respective carrier inputs from a carrier generator 440 and from a quarter-wave delay element 460. The modulators 420, 430 provide outputs to a summing device 470. Summing device 470 provides the QAM modulated output signal.

The QAM output signal may be of the form described by the following formula:

$$S_{QAM}(t) = A[a_I(t) \cos \omega_c t + a_Q(t) \sin \omega_c t] \quad (4)$$

where:

A is a constant;

$a_I(t)$ is the in-phase component of the modulating signal;

$a_Q(t)$ is the quadrature component of the modulating signal;

a(t) equals $a_I(t)$ plus $a_Q(t)$;

$\omega_c$ is the carrier angular frequency;

t is the variable for time; and $a_I(t)$ and $a_Q(t)$ can take on positive or negative values.

Figure 5:
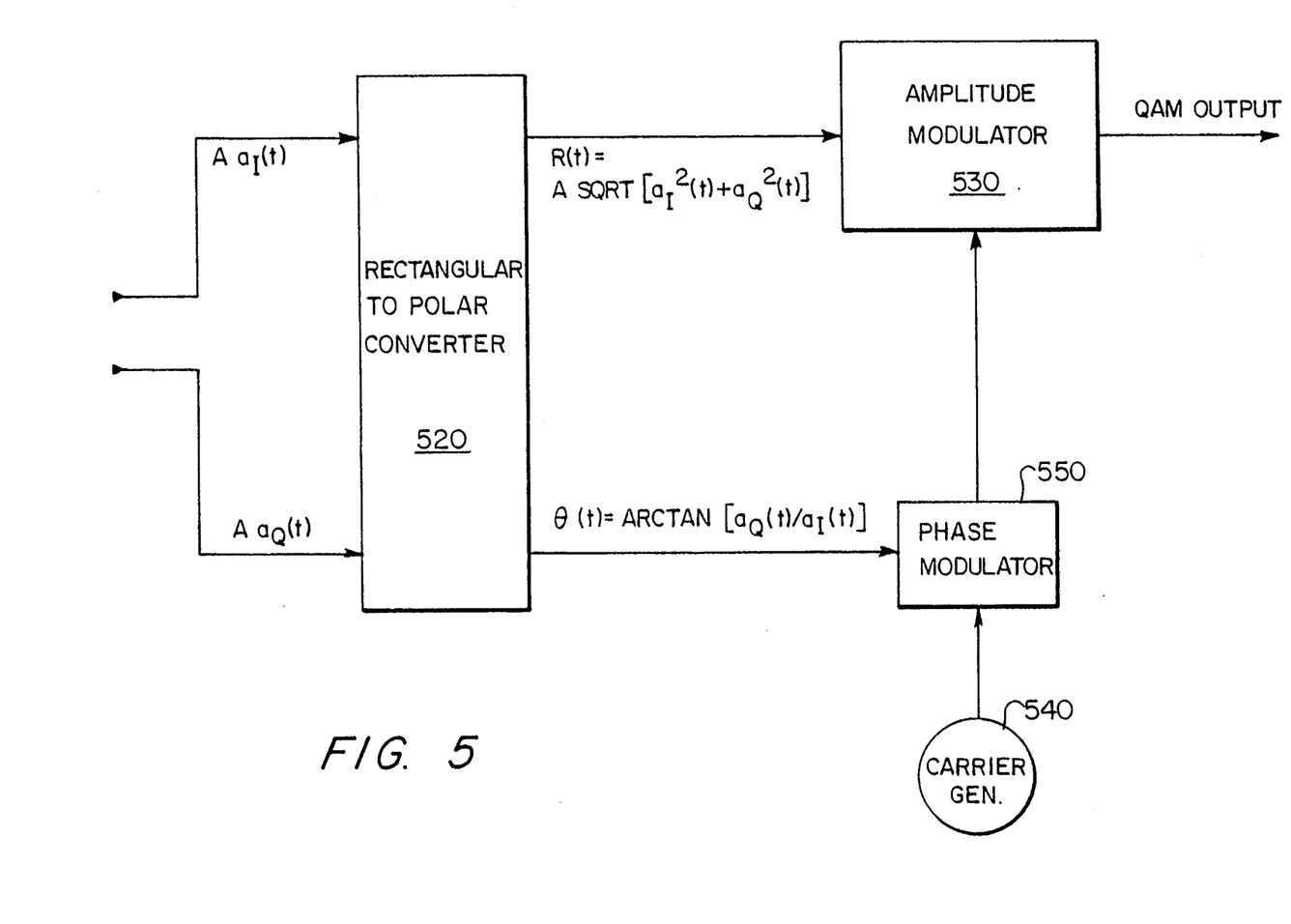
FIG. 5 illustrates a further embodiment of a quadrature amplitude modulator according to the present invention.

Referring now to FIG. 5, still another quadrature amplitude modulator according to the present invention is illustrated. The invention of FIG. 5 builds on the advantages of the embodiments of FIGS. 2–4, and provides additional benefits relating to power savings and lower required Nyquist sampling rates.

The embodiment of FIG. 5 avoids use of the combiners (summing devices) 370 in FIG. 3 (which dissipate half the power from the individual digital amplitude modulators $330_1$, $330_2$ when the combiner's input signals are not coherent in phase and amplitude). In the case of quadrature amplitude modulation, this lack of coherence is always the case because $a_I(t)$ and $a_Q(t)$ are independent of each other. Also, because of the manner in which the in-phase and quadrature components are summed, there is a discontinuity in the waveform at the crossover point. This discontinuity introduces energy at high frequencies, necessitating use of gated Class C amplifiers to fulfill higher Nyquist sampling rate requirements.

The embodiment of FIG. 5 takes advantage of a polar coordinate representation of the input modulating signal, as opposed to the rectangular coordinate representation used in the foregoing embodiments. As shown in FIG. 5, a rectangular to polar converter 520 receives an input modulating signal in the form of in-phase and quadrature signal components. Converter 520 provides magnitude and phase output signals. The magnitude and phase output signals are of the form:

$$R(t) = \sqrt{[a_I(t)]^2 + [a_Q(t)]^2} \quad (5)$$

$$\Theta(t) = \arctan\left(\frac{a_Q(t)}{a_I(t)}\right) \quad (6)$$

These respective amplitude and phase representations indicate a polar coordinate representation of the modulating signal which is expressed as:

$$S(t) = R(t)e^{j\theta(t)} \tag{7}$$

The FIG. 5 embodiment is also provided with a carrier generator 540 which is substantially the same as carrier generators in previously described embodiments. A phase modulator 550 receives the output of the carrier generator 540 as a signal input. Phase modulator 550 also receives the phase representation of the input modulating signal $\theta(t)$ as a phase modulating input. Phase modulator 550 thus modulates the carrier from carrier generator 540 in accordance with the phase of the modulating input signal, providing the phase-modulated carrier to the carrier input of amplitude modulator 530.

Amplitude modulator 530 is preferably implemented in accordance with the teachings of the '931 patent illustrated in FIG. 1. Converter 520 provides the amplitude R(t) of the modulating signal to the modulator's amplitude input. It is understood that the amplitude input corresponds to the signal between elements 36, 38 of FIG. 1, and that the carrier (here, phase) input corresponds to the RF signal generator 46 (FIG. 1).

Modulator 530 therefore provides a quadrature amplitude modulation output which provides the advantages of the FIG. 4A, 4B embodiments, but provides further advantages of increased power efficiency and lower Nyquist sampling rate requirements.

Figure 6:
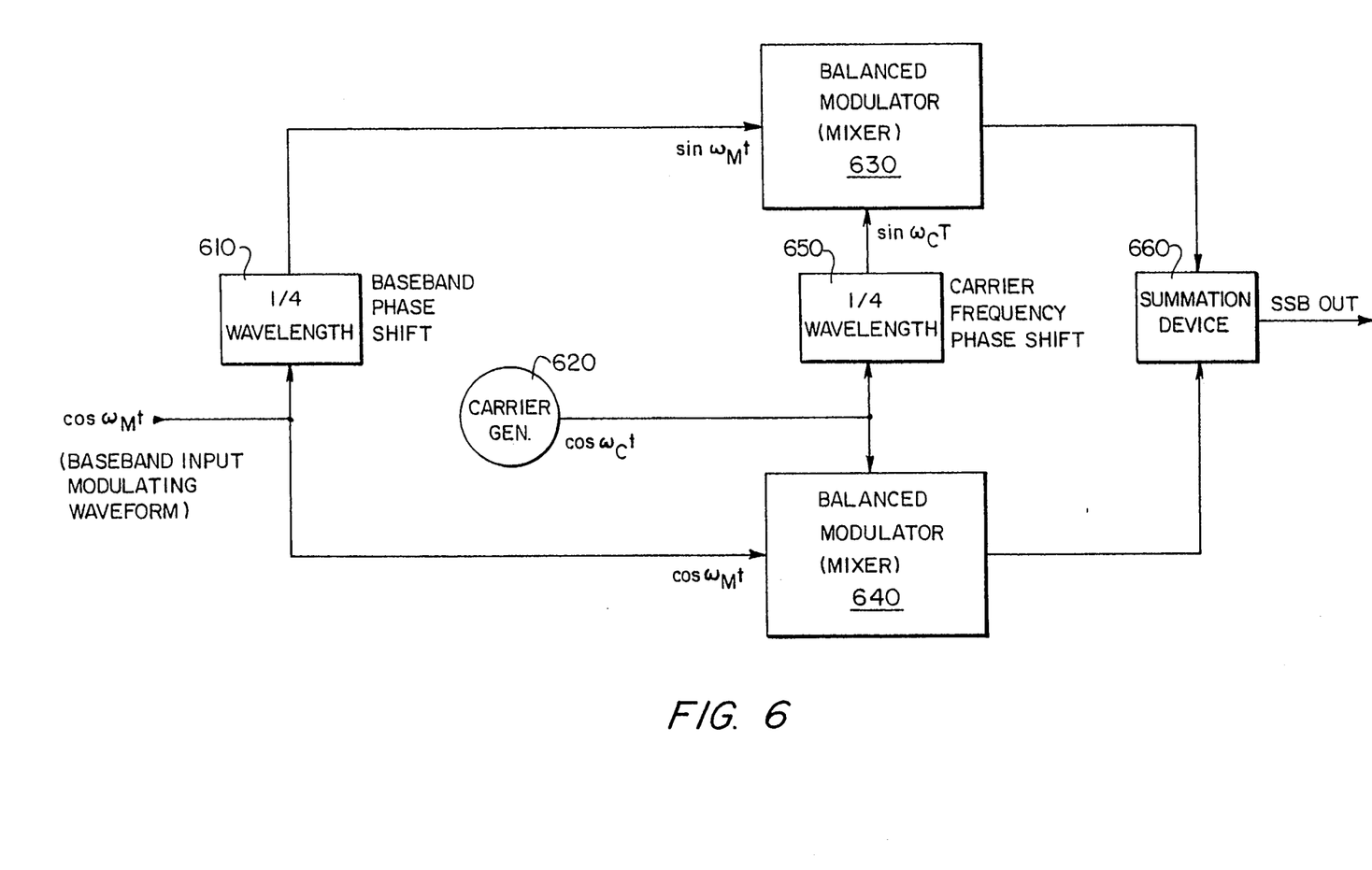
FIG. 6 illustrates an exemplary single sideband modulator employing balanced modulators according to the present invention.

Referring now to FIG. 6, a further aspect of the present invention, a single sideband modulator, is illustrated.

A baseband input modulating waveform, here shown as $\cos \omega_M t$, is shown entering a baseband quarter-wavelength phase shifter 610 and the amplitude input of a balanced modulator 640. The output of phase shifter 610 is input to the amplitude input of a balanced modulator 630. The balanced modulators 630, 640 are preferably of the type described in the above embodiments.

Also illustrated in FIG. 6 is a carrier generator 620 which provides a carrier-frequency signal to the carrier input of balanced modulator 640 and to a carrier frequency quarter-wavelength phase shifter 650. Phase shifter 650 provides a phase-shifted carrier input to the balanced modulator 630. The respective outputs of balanced modulators 630, 640 are input to a summation device 660, preferably an in-phase power combiner. Summation device 660 provides the single sideband output.

As will be appreciated by those skilled in the art, the output of balanced modulator 630 may be expressed as:

$$\sin \omega_c t \sin \omega_M t = \tfrac{1}{2} \cos (\omega_c - \omega_M)t - \tfrac{1}{2} \cos (\omega_c + \omega_M)t \tag{8}$$

Similarly, the output of balanced modulator 640 may be expressed as:

$$\cos \omega_c t \cos \omega_M t = \tfrac{1}{2} \cos (\omega_c - \omega_M)t + \tfrac{1}{2} \cos (\omega_c + \omega_M)t \tag{9}$$

By implication, the single sideband output may be expressed as:

$$SSB = \cos (\omega_c - \omega_M)t \tag{10}$$

The illustrated device produces a lower sideband signal. However, by switching exactly one (not both) of the phase shifters 610, 650 onto the other side of its respective input node so that it directly feeds balanced modulator 640 instead of balanced modulator 630, an upper sideband SSB modulator is produced.

Figure 7:
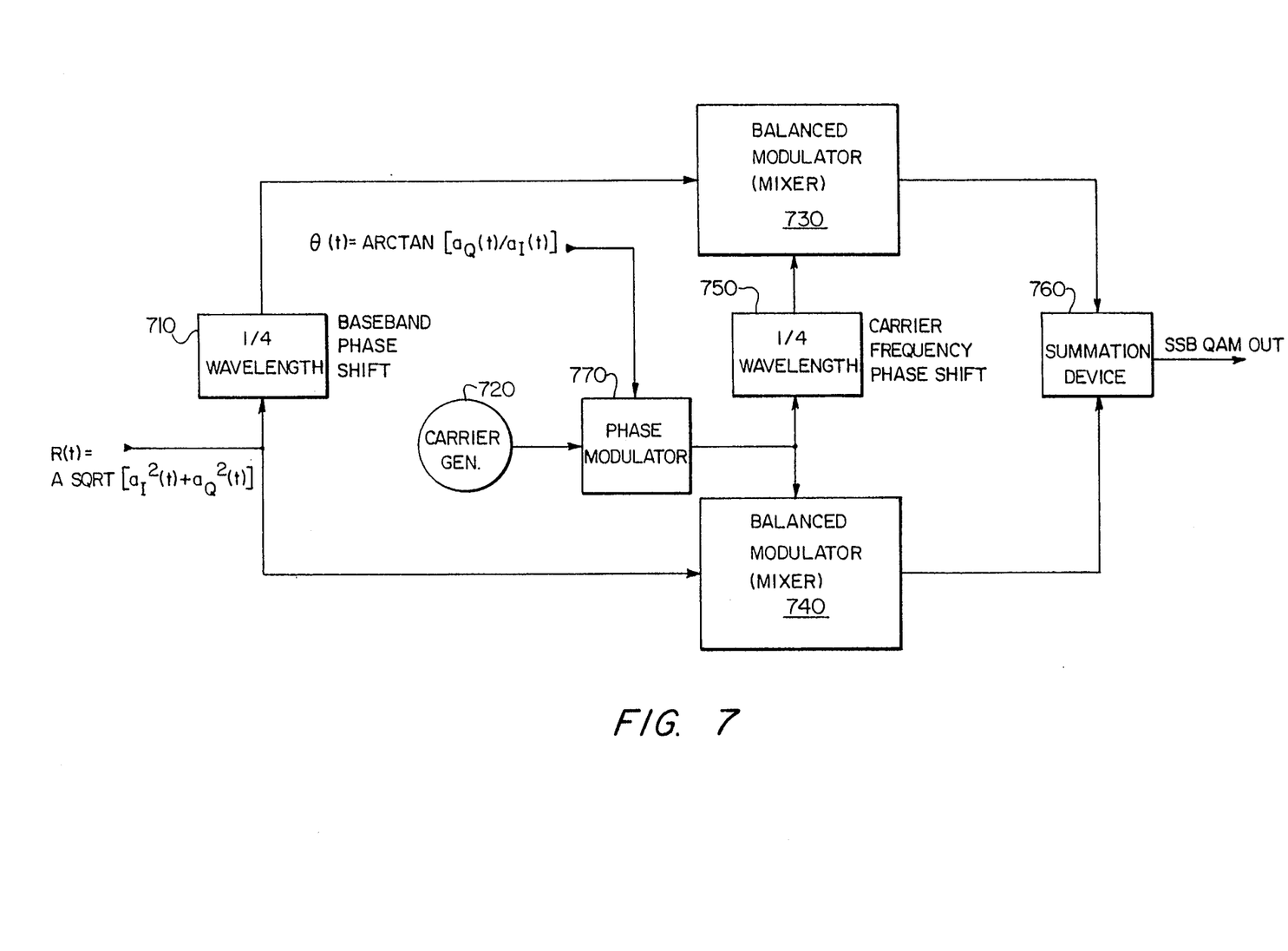
FIG. 7 illustrates an exemplary single sideband quadrature amplitude modulator according to the present invention.

Referring now to FIG. 7, a single sideband quadrature amplitude modulator is illustrated. The FIG. 7 modulator closely resembles the single sideband modulator of FIG. 6. Baseband phase shifter 710, carrier generator 720, balanced modulators 730, 740, carrier frequency phase shifter 750, and summation device 760 may be implemented as corresponding FIG. 6 elements 610, 620, 630, 640, 650 and 660.

However, a phase modulator 770, operating in substantially the same manner as phase modulator 550 (FIG. 5), is inserted at the output of carrier generator 720. Moreover, to employ the advantages of the polar coordinate representation of the input modulating signal, the inputs to the baseband phase shifter 710 and balanced modulator 740 is the modulating signal's magnitude R(t), expressed in general form in Formula (5), above. Phase modulator 770 receives at its modulating input the phase function $\theta(t)$ expressed in Formula (6), above.

In operation, the modulating inputs of the balanced modulators 730, 740 receive respective signals which constitute the magnitude R(t) of the input modulating signal, offset from each other by one-quarter baseband wavelength. The carrier inputs of the two balanced modulators 730, 740 receive respective carrier signals which have been offset from each other by one-quarter carrier wavelength, after being phase-modulated by the phase $\theta(t)$ of the input modulating signal. The outputs of the balanced modulators 730, 740 are summed by element 760, to provide the single sideband, quadrature amplitude modulation output signal. The FIG. 7 single sideband, quadrature amplitude modulator may be considered to combine the advantages of the FIG. 5 QAM modulator and the FIG. 6 SSB modulator.

It will be appreciated that the various combining (summation) devices in the illustrated embodiments may be implemented in various ways. For example, ninety degree hybrid combiners such as those described in the '931 patent may be employed, as they provide proper isolation of the inputs while minimizing wasted power. However, other combining (summation) devices may be employed, such as in-phase Wilkinson combiners and branch combiners, based on their suitability to a particular implementation.

In addition to the illustrated uses of the present invention, the balanced modulators may readily be used for up conversion, down conversion, synchronous detection, product detection, and other known uses of mixers.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A quadrature amplitude modulation (QAM) modulator for modulating an input modulating signal and for providing a QAM output signal, the modulator comprising:

a) an amplitude modulator having;
      1) an amplitude input responsive to a magnitude of the input modulating signal,
      2) a carrier input, and 3) a modulator output providing the QAM output signal wherein the QAM output signal is represented by any point in a two-dimensional planar area, the point being represented by:
1) a distance from an origin, determined in accordance with the magnitude of the input modulating signal; and
2) an angle, determined in accordance with the phase of the input modulating signal;
b) a carrier generator having a first carrier output signal; and
c) a phase modulator having:
1) a carrier input responsive to the first carrier signal,
2) a phase modulating input responsive to the phase signal indicative of the phase of the input modulating signal to the amplitude modulator, and
3) a phase modulator output providing a phase modulator output carrier signal which constitutes the first carrier output signal shifted in phase in accordance with the phase modulator's phase modulating input signal, the phase modulator output carrier signal being provided to the carrier input of the amplitude modulator.

2. The QAM modulator of claim 1, wherein the amplitude modulator includes:
a) a plurality of component signal generation devices, responsive to the amplitude input and to the carrier input and outputting a corresponding plurality of component signals, wherein:
1) each component signal output has a strength that is a predetermined multiple of a strength of a component signal of a preceding component signal generation device; and
2) the modulator's amplitude input controls the magnitude of the plurality of component signals; and
b) a plurality of combiners arranged in cascade, each combiner being connected to a respective component signal generation device, wherein:
1) each combiner after a first combiner combines (i) a combiner output from a previous combiner and (ii) the component signal output from its respective component signal generation device; and
2) a last combiner provides a modulator output signal indicative of a sum of the component signals.

3. The QAM modulator of claim 1, further comprising:
d) a rectangular-to-polar converter for receiving in-phase and quadrature input signals representing the input modulating signal, and for providing as representative of the input modulating signal:
1) an amplitude signal indicative of the magnitude of the input modulating signal, which amplitude signal is input to the amplitude modulator's amplitude input; and
2) the phase signal indicative of the phase of the input modulating signal, which phase signal is input to the phase modulator's phase modulating input.

4. The QAM modulator of claim 3, wherein the amplitude modulator includes:
a) a plurality of component signal generation devices, responsive to the amplitude input and to the carrier input and outputting a corresponding plurality of component signals, wherein:
1) each component signal output has a strength that is a predetermined multiple of a strength of a component signal of a preceding component signal generation device; and
2) the modulator's amplitude input controls the magnitude of the plurality of component signals; and
b) a plurality of combiners arranged in cascade, each combiner being connected to a respective component signal generation device, wherein:
1) each combiner after a first combiner combines (i) a combiner output from a previous combiner and (ii) the component signal output from its respective component signal generation device; and
2) a last combiner provides a modulator output signal indicative of a sum of the component signals.

* * * * *